(12) United States Patent
Lim et al.

(10) Patent No.: US 8,976,564 B2
(45) Date of Patent: Mar. 10, 2015

(54) ANTI-FUSE CIRCUIT AND SEMICONDUCTOR DEVICE HAVING THE SAME

(71) Applicant: Samsung Electronics Co., Ltd., Suwon-si (KR)

(72) Inventors: Young-Il Lim, Suwon-si (KR); Cheol Kim, Seoul (KR); Sang-Ho Shin, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 158 days.

(21) Appl. No.: 13/748,773

(22) Filed: Jan. 24, 2013

(65) Prior Publication Data

US 2013/0215662 A1     Aug. 22, 2013

(30) Foreign Application Priority Data

Feb. 20, 2012 (KR) .................. 10-2012-0017091

(51) Int. Cl.
G11C 17/00 (2006.01)
G11C 17/16 (2006.01)
G11C 29/00 (2006.01)

(52) U.S. Cl.
CPC ............ *G11C 17/00* (2013.01); *G11C 17/16* (2013.01); *G11C 29/785* (2013.01)
USPC .......................................... 365/94; 365/225.7

(58) Field of Classification Search
USPC ................................. 365/94, 225.7
See application file for complete search history.

(56) References Cited

U.S. PATENT DOCUMENTS

| | | | |
|---|---|---|---|
| 5,811,869 | A | 9/1998 | Seyyedy et al. |
| 6,243,294 | B1 | 6/2001 | Rao et al. |
| 6,667,902 | B2 | 12/2003 | Peng |
| 6,671,040 | B2 | 12/2003 | Fong et al. |
| 6,777,757 | B2 | 8/2004 | Peng et al. |
| 6,812,122 | B2 | 11/2004 | Bertin et al. |
| 6,972,986 | B2 | 12/2005 | Peng et al. |
| 7,173,851 | B1 | 2/2007 | Callahan et al. |
| 7,642,138 | B2 | 1/2010 | Kurjanowicz |
| 7,755,162 | B2 | 7/2010 | Kurjanowicz et al. |
| 7,764,532 | B2 | 7/2010 | Kurjanowicz et al. |
| 8,026,574 | B2 | 9/2011 | Kurjanowicz et al. |
| 8,130,532 | B2 | 3/2012 | Kurjanowicz et al. |
| 2008/0237673 | A1 | 10/2008 | Wada et al. |
| 2011/0312169 | A1 | 12/2011 | Kurjanowicz et al. |
| 2012/0051154 | A1* | 3/2012 | Son et al. ............. 365/189.07 |

FOREIGN PATENT DOCUMENTS

| | | |
|---|---|---|
| JP | 11502068 | 2/1999 |
| JP | 2008-091451 | 4/2008 |
| KR | 100416860 | 7/2001 |
| KR | 100323174 | 1/2002 |
| KR | 1020090094367 A | 9/2009 |

* cited by examiner

*Primary Examiner* — Huan Hoang
(74) *Attorney, Agent, or Firm* — Muir Patent Law

(57) ABSTRACT

A memory device includes an anti-fuse cell array including a plurality of anti-fuse cells. Each anti-fuse cell includes a first cell transistor connected to a common node, a second cell transistor connected to the common node, and an access transistor connected to the common node. The first cell transistor is configured to store data and the second cell transistor is configured to store data when the first cell transistor has defect data.

19 Claims, 6 Drawing Sheets

ANTI-FUSE CIRCUIT AND SEMICONDUCTOR DEVICE HAVING THE SAME

CROSS-REFERENCE TO RELATED APPLICATION

This application claims priority under 35 U.S.C. §119 to Korean Patent Application No. 10-2012-0017091 filed on Feb. 20, 2012, the entire contents of which are incorporated herein by reference in their entirety.

BACKGROUND

Example embodiments relate to an anti-fuse circuit and a semiconductor device having the same.

A fuse or anti-fuse may be used for a semiconductor device, particularly, a semiconductor memory device. The fuse may be turned off when conditions are satisfied, while the anti-fuse may be turned on when desired conditions are satisfied. The fuse or anti-fuse may be used to select an operation mode of the semiconductor device, or enable a redundancy array when a defective cell is included in a memory cell array.

An anti-fuse circuit may break down a gate oxide layer of an anti-fuse cell transistor included in the anti-fuse circuit and sense a state of a broken anti-fuse. However, even if the gate oxide layer of the anti-fuse cell transistor is broken down, there may be cases where it is difficult or impossible to sense a state of the anti-fuse according to a breakdown state.

Accordingly, an anti-fuse circuit including not only a normal cell array having normal cell transistors but also a vote cell array having the same configuration as the normal cell array, has conventionally been used. As a result, an area occupied by the conventional anti-fuse circuit within a chip is increased.

SUMMARY

Some example embodiments provide an anti-fuse circuit capable of easily sensing an anti-fusing state.

Other embodiments provide a semiconductor memory device including the anti-fuse circuit.

Other embodiments provide a semiconductor device including the anti-fuse circuit.

The anti-fuse circuit includes an anti-fuse cell driving circuit and an anti-fuse cell array.

The anti-fuse cell driving circuit generates a normal cell driving voltage and a vote cell driving voltage. The anti-fuse cell array includes a plurality of anti-fuse cells, and each of the anti-fuse cells includes a normal cell transistor and a vote cell transistor connected in parallel to each other. The normal cell driving voltage applies to the normal cell transistor, and the vote cell driving voltage applies to the vote cell transistor. The normal cell transistor stores data in response to the normal cell driving voltage having the first voltage level and the vote cell driving voltage having the second voltage level. When the normal cell transistor has defect data, the vote cell transistor stores data in response to the vote cell driving voltage having the first voltage level.

In accordance with another example embodiment, an anti-fuse cell includes a first MOS transistor, a second MOS transistor, and a third MOS transistor.

The first MOS transistor has a control terminal to which a first cell driving voltage is applied, a first terminal, and a second terminal electrically connected to a first node. The first MOS transistor is configured to store data in response to the first cell driving voltage. The second MOS transistor has a control terminal to which a second cell driving voltage is applied, a first terminal, and a second terminal electrically connected to the first node. The second MOS transistor is configured to store data in response to the second cell driving voltage. The third MOS transistor has a control terminal to which a driving signal is applied, a first terminal connected to the first node, and a second terminal connected to a bit line in response to the driving signal. The third MOS transistor forms a current path between the first node and the bit line.

The first MOS transistor may be a normal cell transistor, and the second MOS transistor may be a vote cell transistor.

When an anti-fusing operation is performed on the normal cell transistor, the first cell driving voltage applied to the control terminal of the first MOS transistor may have a first voltage level, the second cell driving voltage applied to the control terminal of the second MOS transistor may have a second voltage level lower than the first voltage level, and a voltage having a third voltage level lower than the second voltage level may be applied to the bit line.

When an anti-fusing operation is performed on the vote cell transistor, the control terminal of the first MOS transistor may be floated, the second cell driving voltage applied to the control terminal of the second MOS transistor may have the first voltage level, and a voltage having the third voltage level lower than the second voltage level may be applied to the bit line.

In accordance with another example embodiment, a semiconductor memory device includes a memory cell array, a column decoder, and a redundant column decoder.

The memory cell array includes a normal memory cell array including a plurality of normal memory cells connected to word lines and column selection lines, and a redundant memory cell array including a plurality of spare memory cells connected to redundant word lines and redundant column selection lines. The column decoder decodes column address signals, generates column selection signals, and transmits the column selection signals to the column selection lines. When a defect occurs in at least one of normal memory cells connected to the column selection lines, the redundant column decoder decodes the column address signals, generates redundant column selection signals, and transmits the redundant column selection signals to the redundant column selection lines. The redundant column decoder includes an anti-fuse cell driving circuit and a anti-fuse cell. The anti-fuse cell driving circuit generates a normal cell driving voltage and a vote cell driving voltage. The anti-fuse cell includes a normal cell transistor and a vote cell transistor connected in parallel to each other, and performs a fuse operation in response to the normal cell driving voltage and the vote cell driving voltage.

In accordance with another example embodiment, a memory system includes a memory controller and a semiconductor memory device.

The memory controller generates an address signal and a command signal. The semiconductor memory device stores received data or outputs stored data in response to the address signal and the command signal. The semiconductor memory device includes an anti-fuse cell driving circuit and a anti-fuse cell. The anti-fuse cell driving circuit generates a normal cell driving voltage and a vote cell driving voltage. The anti-fuse cell includes a normal cell transistor and a vote cell transistor connected in parallel to each other, and performs a fuse operation in response to the normal cell driving voltage and the vote cell driving voltage.

In accordance with another example embodiment, a semiconductor device includes an anti-fuse circuit and an internal circuit.

The anti-fuse circuit includes an anti-fuse cell driving circuit and a anti-fuse cell. The anti-fuse cell driving circuit generates a normal cell driving voltage and a vote cell driving voltage. The unit anti-fuse cell includes a normal cell transistor and a vote cell transistor connected in parallel to each other, and performs a fuse operation in response to the normal cell driving voltage and the vote cell driving voltage.

In accordance with another example embodiment, a memory device includes an anti-fuse cell array including a plurality of anti-fuse cells, each anti-fuse cell including a first cell transistor connected to a common node, a second cell transistor connected to the common node, and an access transistor connected to the common node. The first and second cell transistors are configured to store data. The second cell transistor is configured to store data when the first cell transistor has defect data.

BRIEF DESCRIPTION OF THE DRAWINGS

Various example embodiments will be described below in more detail with reference to the accompanying drawings. In the drawings.

DETAILED DESCRIPTION OF THE EMBODIMENTS

Figure 1:
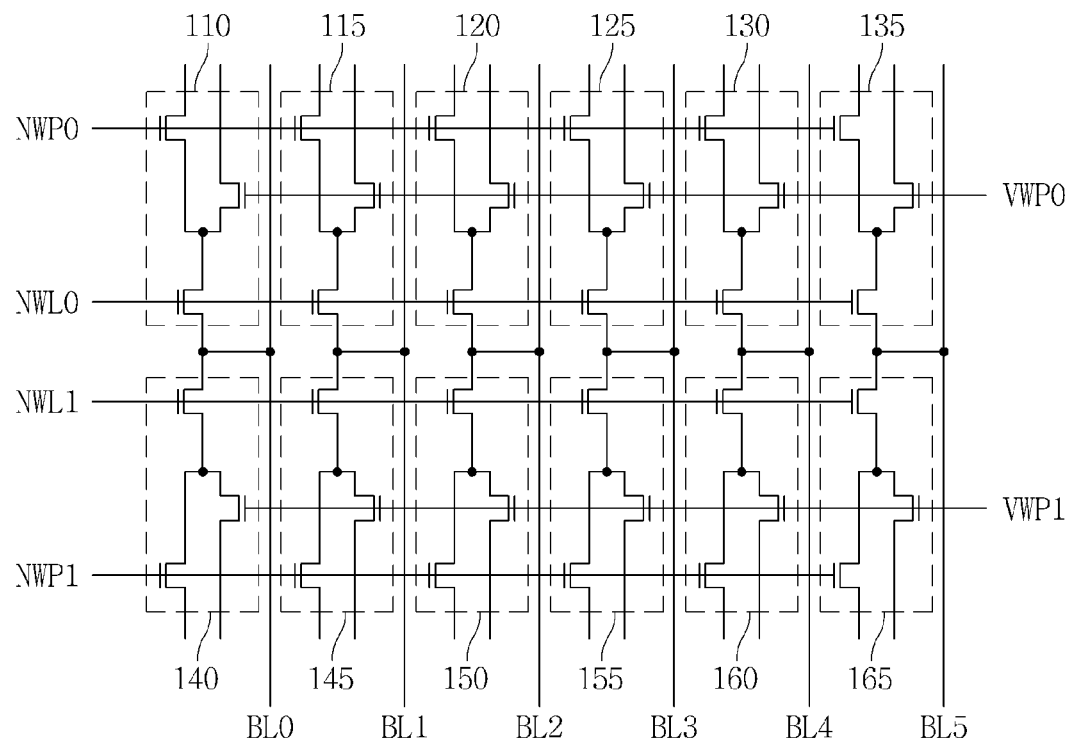
FIG. 1 is a circuit diagram of an anti-fuse cell array according to example embodiments.

Example embodiments of the present disclosure will be described more fully hereinafter with reference to the accompanying drawings, in which some example embodiments are shown. It is important to understand that the present disclosure may be embodied in many alternate forms and should not be construed as limited to the example embodiments set forth herein. Accordingly, while the disclosure can be modified in various ways and take on various alternative forms, specific embodiments thereof are shown in the drawings and described in detail below as examples. There is no intent to limit the disclosure to the particular forms disclosed. Elements of the example embodiments are consistently denoted by the same reference numerals throughout the drawings and detailed description.

It will be understood that, although the terms first, second, A, B, etc. may be used herein in reference to elements of the invention, such elements should not be construed as limited by these terms unless indicated otherwise. For example, a first element could be termed a second element, and a second element could be termed a first element, without departing from the scope of the present disclosure. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe various embodiments is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms such as "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

Unless expressly defined in a specific order herein, respective steps described in the present disclosure may be performed otherwise. That is, the respective steps may be performed in a specified order, substantially at the same time, or in reverse order.

FIG. 1 is a circuit diagram of an anti-fuse cell array 100 according to example embodiments. FIG. 1 illustrates an example of an anti-fuse cell array 100 used for a semiconductor memory device.

Referring to FIG. 1, the anti-fuse cell array 100 may include unit anti-fuse cells 110, 115, 120, 125, 130, and 135 configured to perform fuse operations in response to a first normal cell driving voltage NWP0, a first vote cell driving voltage VWP0, and a first word line driving signal NWL0, and unit anti-fuse cells 140, 145, 150, 155, 160, and 165 configured to perform fuse operations in response to a second normal cell driving voltage NWP1, a second vote cell driving voltage VWP1, and a second word line driving signal NWL1.

Each of the first and second normal cell driving voltages NWP0 and NWP1, the first and second vote cell driving voltages VWP0 and VWP1, and the first and second word line driving signals NWL0 and NWL1 may be generated in response to address signals. Each of the unit anti-fuse cells may include a normal cell transistor and a vote cell transistor connected in parallel to each other, and an output terminal of each of the unit anti-fuse cells may be electrically connected to the corresponding one of bit lines BL0, BL1, BL2, BL3, BL4, and BL5. Each of the bit lines BL0, BL1, BL2, BL3, BL4, and BL5 may be selected in response to address signals.

Although FIG. 1 illustrates the anti-fuse cell array 100 including anti-fuse cells arranged in two rows, the anti-fuse cell array 100 may include anti-fuse cells arranged in an arbitrary number of rows.

Figure 2:
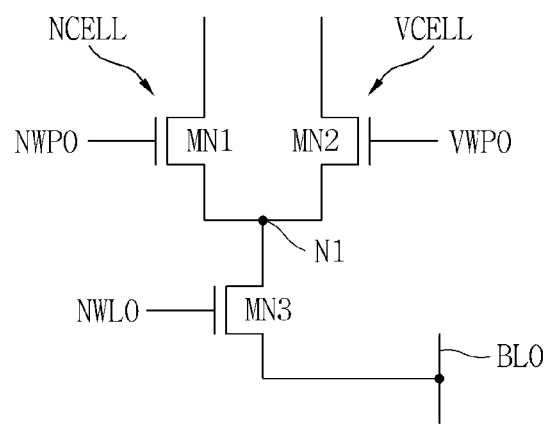
FIG. 2 is a circuit diagram of an example of a configuration of a unit anti-fuse cell constituting the anti-fuse cell array of FIG. 1 according to example embodiments.

FIG. 2 is a circuit diagram of an example of a configuration of a unit anti-fuse cell 110 constituting the anti-fuse cell array of FIG. 1 according to example embodiments.

Referring to FIG. 2, the unit anti-fuse cell 110 may include a first NMOS transistor MN1, a second NMOS transistor MN2, and a third NMOS transistor MN3.

The first NMOS transistor MN1 may have a control terminal to which the normal cell driving voltage NWP0 is applied, a floated first output terminal, and a second output terminal electrically connected to a first node N1, and a gate insulating layer may be broken down in response to the normal cell driving voltage NWP0. The second NMOS transistor MN2 may have a control terminal to which the vote cell driving voltage VWP0 is applied, a floated first output terminal, and a second output terminal electrically connected to the first node N1, and a gate insulating layer may be broken down in response to the vote cell driving voltage VWP0. The third NMOS transistor MN3 may have a control terminal to which a driving signal is applied, a first output terminal connected to the first node N1, and a second output terminal connected to the bit line BL0. A current path may be formed between the first node N1 and the bit line BL0 in response to the first word line driving signal NWL0.

In FIG. 2, the first NMOS transistor MN1 may be a normal cell transistor, and the second NMOS transistor MN2 may be a vote cell transistor.

Figure 3:
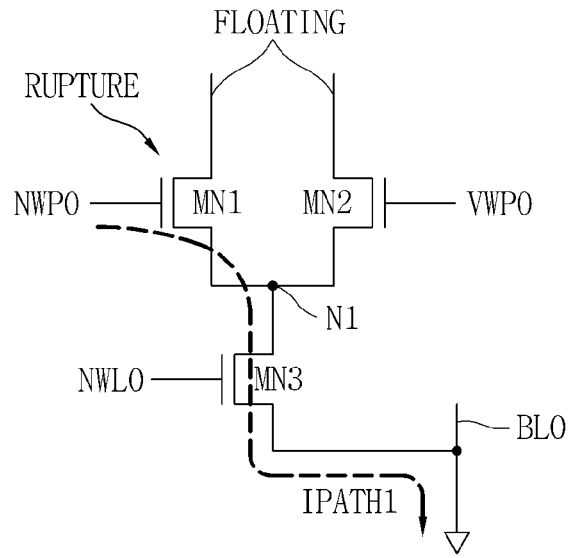
FIG. 3 is a circuit diagram of an operation of the unit anti-fuse cell of FIG. 2 when a gate oxide layer of a normal cell is broken down according to certain example embodiments.

FIG. 3 is a circuit diagram of an operation of the unit anti-fuse cell of FIG. 2 when a gate oxide layer of a normal cell is broken down according to certain example embodiments.

Referring to FIG. 3, when an anti-fusing operation performs on a normal cell transistor, the normal cell driving voltage NWP0 applied to the control terminal of the first NMOS transistor MN1 may have a first voltage level, and the vote cell driving voltage VWP0 applied to the control terminal of the second NMOS transistor MN2 may have a second voltage level lower than the first voltage level. Also, a voltage having a third voltage level lower than the second voltage level may be applied to the bit line BL0.

In an example of FIG. 3, a voltage of about 6.5V or 2Vcc (herein after, Vcc is a power supply voltage or a cell array voltage) may be applied to the control terminal of the first NMOS transistor MN1, a voltage of about 3V or Vcc may be applied to the control terminal of the second NMOS transistor MN2 and the control terminal of the third NMOS transistor MN3, and a voltage of about 0V may be applied to the bit line BL0. Under these conditions, a gate oxide layer of the first NMOS transistor MN1 may be broken down or ruptured, and a current path IPATH1 leading from the control terminal of the first NMOS transistor MN1 (i.e., a gate of the first NMOS transistor MN1) through the third NMOS transistor MN3 to the bit line BL0 may be formed. In one embodiment, a sensing circuit (not shown) may sense the current to output a logic low level or a logic high level depending on an amount of the current. For example, the sensing circuit may generate a logic high level when the current is higher than a certain value, and may generate a logic low level when the current is lower than the certain value. If the first NMOS transistor MN1 has a defect data after performing the anti-fusing operation on the first NMOS transistor MN1, the sensing circuit may sense a low current. Accordingly, the first NMOS transistor MN1 should not be used as an anti-fuse cell.

Figure 4:
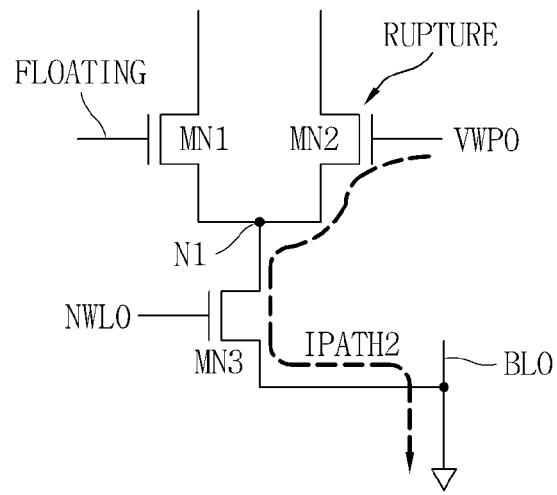
FIG. 4 is a circuit diagram of an operation of the unit anti-fuse cell of FIG. 2 when a gate oxide layer of a vote cell is broken down according to certain example embodiments.

FIG. 4 is a circuit diagram of an operation of the unit anti-fuse cell of FIG. 2 when a gate oxide layer of a vote cell is broken down according to certain example embodiments.

Referring to FIG. 4, when an anti-fusing operation performs on the vote cell transistor, the control terminal of the first NMOS transistor MN1 may be floated, the vote cell driving voltage VWP0 applied to the control terminal of the second NMOS transistor MN2 may have the first voltage level, and a voltage having a third voltage level lower than the second voltage level may be applied to the bit line BL0. The anti-fusing operation on the second NMOS transistor MN2 may be performed if the first NMOS transistor MN1 has a defect data after performing the anti-fusing operation on the first NMOS transistor MN1.

In an example of FIG. 4, the control terminal of the first NMOS transistor MN1 may be floated, a voltage, for example, of about 6.5V or 2Vcc may be applied to the control terminal of the second NMOS transistor MN2, a voltage of about 3V or Vcc may be applied to the control terminal of the third NMOS transistor MN3, and a voltage of about 0V may be applied to the bit line BL0. Under these conditions, a gate oxide layer of the second NMOS transistor MN2 may be broken down or ruptured, a current path IPATH2 leading from the control terminal of the second NMOS transistor MN2 (i.e., a gate of the second NMOS transistor MN2) through the third NMOS transistor MN3 to the bit line BL0 may be formed.

The unit anti-fuse cell 110 shown in FIG. 2 may include an anti-fuse cell driving circuit configured to generate a normal cell driving voltage and a vote cell driving voltage, and a normal cell transistor and a vote cell transistor connected in parallel to each other. The unit anti-fuse cell 110 shown in FIG. 2 may perform a fuse operation in response to the normal cell driving voltage and the vote cell driving voltage. Accordingly, an anti-fuse circuit including unit anti-fuse cells 110 may easily sense an anti-fusing state using a simple circuit configuration.

Figure 5:
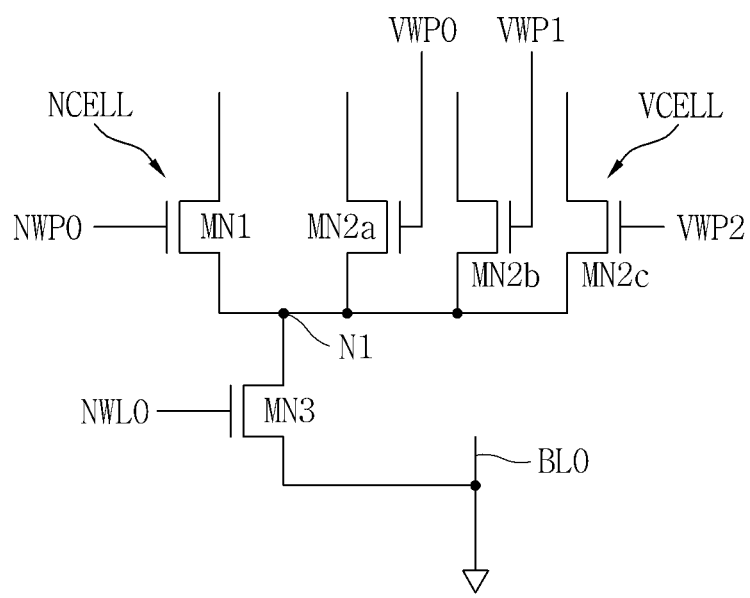
FIG. 5 is a circuit diagram of another example of a configuration of the unit anti-fuse cell constituting the anti-fuse cell array of FIG. 1 according to example embodiments.

FIG. 5 is a circuit diagram of another example of a configuration of the unit anti-fuse cell 110 constituting the anti-fuse cell array of FIG. 1 according to example embodiments.

Referring to FIG. 5, a unit anti-fuse cell 110a may include a first NMOS transistor MN1, second NMOS transistors MN2a, MN2b, and MN2c, and a third NMOS transistor MN3.

The first NMOS transistor MN1 may have a control terminal to which a normal cell driving voltage NWP0 is applied, a floated first output terminal, and a second output terminal electrically connected to a first node N1, and a gate insulating layer may be broken down in response to a normal cell driving voltage NWP0. Each of the second NMOS transistors MN2a, MN2b, and MN2c may have a control terminal to which vote cell driving voltages VWP0, VWP1, and VWP2 is applied, respectively, a floated first output terminal, and a second output terminal electrically connected to a first node N1, and a gate insulating layer may be broken down in response to the vote cell driving voltages VWP0 VWP1, and VWP2. For example, if each of the first NMOS transistor MN1 and the second NMOS transistor MN2a has a defect data after performing a respective anti-fusing operation, an anti-fusing operation may be performed on the second NMOS transistor MN2b. Furthermore, if each of the first NMOS transistor MN1 and the second NMOS transistors MN2a and MN2b has a defect data after performing a respective anti-fusing operation, an anti-fusing operation may be performed on the second NMOS transistor MN2c. The third NMOS transistor MN3 may have a control terminal to which a driving signal is applied, a first output terminal connected to the first node N1, and a second output terminal connected to a bit line BL0. A current path maybe formed between the first node N1 and the bit line BL0.

In FIG. 5, the first NMOS transistor MN1 may be a normal cell transistor, and each of the second NMOS transistors MN2a, MN2b, and MN2c may be a vote cell transistor. Since the unit anti-fuse cell 110a of FIG. 5 includes a plurality of vote cell transistors, a number of vote cell transistors to be fused may be controlled.

Figure 6:
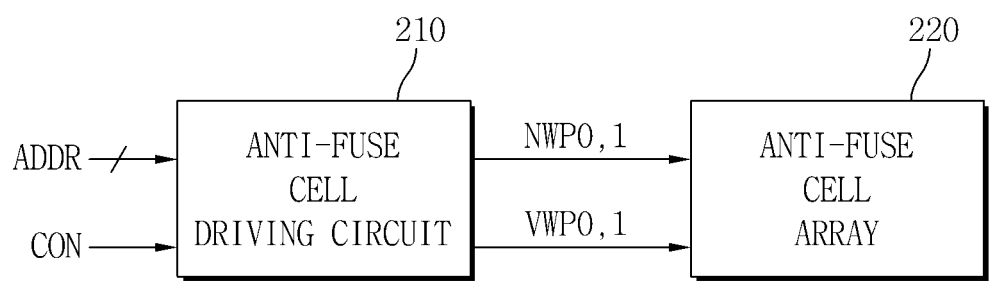
FIG. 6 is a block diagram of an example of an anti-fuse circuit including an anti-fuse cell array according to example embodiments.

FIG. 6 is a block diagram of an example of an anti-fuse circuit 200 including an anti-fuse cell array according to example embodiments.

Referring to FIG. 6, the anti-fuse circuit 200 may include an anti-fuse cell driving circuit 210 and an anti-fuse cell array 220.

The anti-fuse cell driving circuit 210 may generate normal cell driving voltages NWP0 and NWP1 and vote cell driving voltages VWP0 and VWP1. The bit line cell array 220 may include a plurality of unit anti-fuse cells, and each of the unit anti-fuse cells may include a normal cell transistor and a vote cell transistor connected in parallel to each other, and perform an anti-fusing operation in response to the normal cell driving voltages NWP0 and NWP1 and the vote cell driving voltages VWP0 and VWP1.

The anti-fuse cell driving circuit 210 may generate the normal cell driving voltages NWP0 and NWP1 and the vote cell driving voltages VWP0 and VWP1 based on one or more addresses and a control signal CON (e.g., test mode register set (TMRS) signal). The normal cell driving voltage NWP0 and the vote cell driving voltage VWP0 may be generated based on the same address, and the normal cell driving voltage NWP1 and the vote cell driving voltage VWP1 may be generated based on a same address. In one embodiment, the anti-fuse cell driving circuit 210 may generate the first and second word line driving signals NWL0 and NWL1, and may select bit lines BL0 through BL5 based on address signals.

When an output current of the anti-fuse circuit 200 is not sufficiently large for a sensing operation after an anti-fusing operation is performed on the normal cell transistor, the anti-fuse circuit 200 shown in FIG. 6 may perform an anti-fusing operation on the vote cell transistor.

Figure 7:
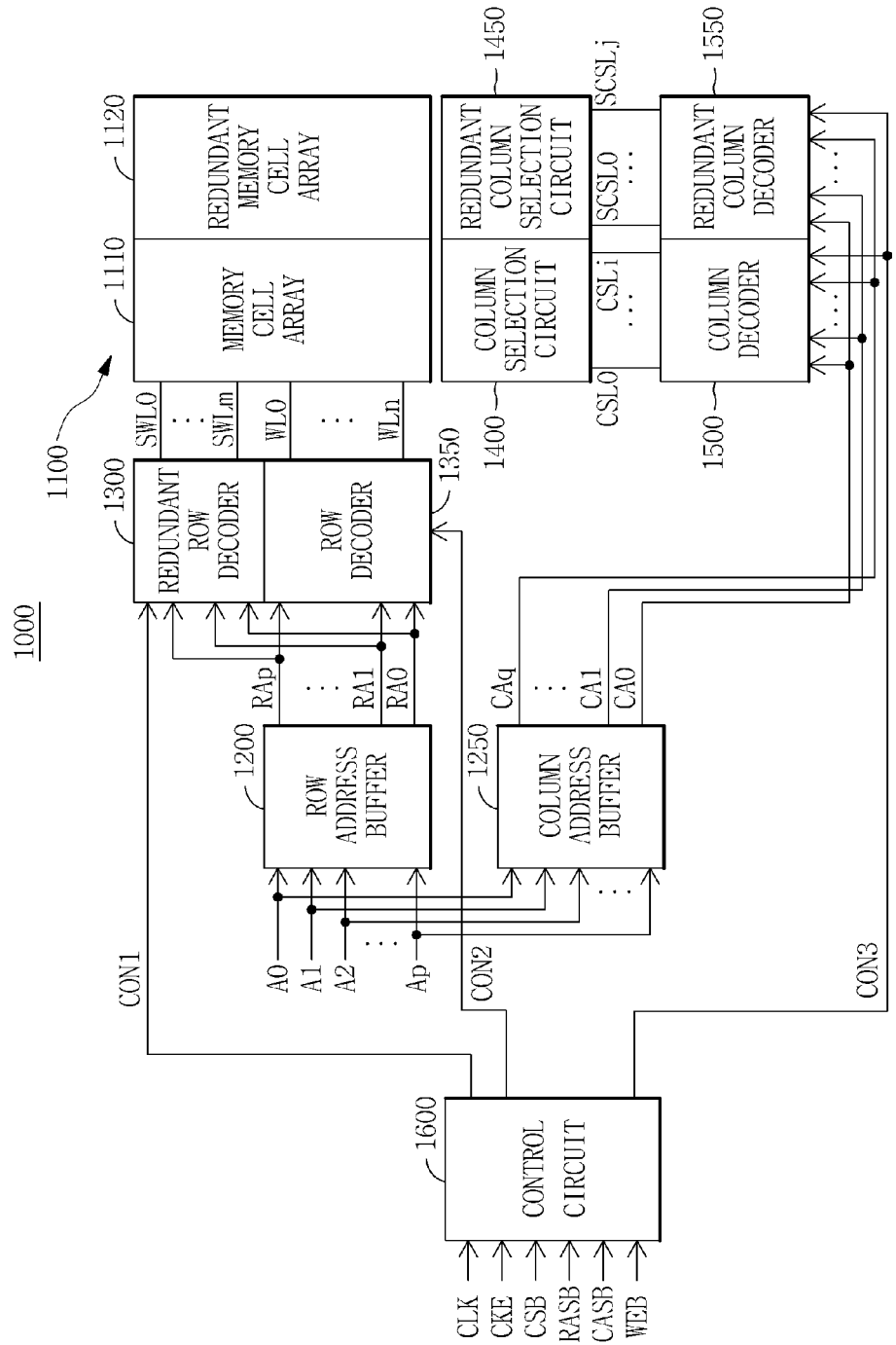
FIG. 7 is a block diagram of an example of a semiconductor memory device including an anti-fuse circuit according to example embodiments.

FIG. 7 is a block diagram of an example of a semiconductor memory device 1000 including an anti-fuse circuit according to example embodiments.

Referring to FIG. 7, the semiconductor memory device 1000 may include a memory cell array 1100, a row address buffer 1200, a column address buffer 1250, a row decoder 1350, a redundant row decoder 1300, a column decoder 1500, a redundant column decoder 1550, a column selection circuit 1400, and a redundant column selection circuit 1450. Also, the semiconductor memory device 1000 may include a control circuit 1600 configured to generate control signals CON1, CON2, and CON3 in response to command signals, such as a clock signal CLK, a clock enable signal CKE, a chip selection signal CSB, a row address strobe signal RASB, a column address strobe signal CASB, and a write enable signal WEB, and control blocks constituting the semiconductor memory device 1000.

The memory cell array 1100 may include a normal memory cell array 1110 including a plurality of normal memory cells connected to word lines and column selection lines, and a redundant memory cell array 1120 including a plurality of redundant memory cells connected to redundant word lines and redundant column selection lines. When at least one of the plurality of normal memory cells defects, the defect cell may be replaced with at least one of the plurality of redundant memory cells. The row address buffer 1200 may buffer address signals A0, A1, . . . , and Ap and generate row address signals RA0, RA1, . . . , and RAp. The column address buffer 1250 may buffer address signals A0, A1, . . . , and Ap and generate column address signals CA0, CA1, . . . , and CAq. In one embodiment, the address signals of the row address buffer 1200 may be different from the address signals of the column address buffer 1250 (for example, different address signals may be received from separate lines).

The row decoder 1350 may decode the row address signals RA0, RA1, . . . , and RAp, generate word line driving signals WL0, . . . , and WLn, and transmit the word line driving signals WL0, . . . , and WLn to the word lines. When defects occur in at least one of the word lines, the redundant row decoder 1300 may decode row address signals RA0, RA1, . . . , and RAp, generate redundant word line driving signals SWL0, . . . , and SWLm, and transmit the word line driving signals SWL0, . . . , and SWLm to the redundant word lines.

The column decoder 1500 may decode the column address signals CA0, CA1, . . . , and CAq, generate column selection signals CSL0, . . . , and CSLi, and transmit the column selection signals CSL0, . . . , and CSLi to the column selection lines. When defects occur in at least one of the column selection lines, the redundant column decoder 1550 may decode column address signals CA0, CA1, . . . , and CAq, generate redundant column selection signals SCSL0, . . . , and SCSLj and transmit the redundant column selection signals SCSL0, . . . , and SCSLj to the redundant column selection lines.

The column selection circuit 1400 may amplify column selection signals CSL0, . . . , and CSLi and control the input/output of data to/from the normal memory cell array 1110. The redundant column selection circuit 1450 may amplify redundant column selection signals SCSL0, . . . , and SCSLj and control the input/output of data to/from the redundant memory cell array 1120.

The redundant row decoder 1300 and/or redundant column decoder 1550 constituting the semiconductor memory device 1000 shown in FIG. 7 may include an anti-fuse circuit according to example embodiments of the present disclosure. Each of unit anti-fuse cells of the anti-fuse circuit included in the redundant row decoder 1300 and/or the redundant column decoder 1550 of the semiconductor memory device 1000 may include a normal cell transistor and a vote cell transistor connected in parallel to each other. When an output current of the anti-fuse circuit is not sufficiently large for a sensing operation after performing the anti-fusing operation on the normal cell transistor, an anti-fusing operation may be performed on the vote cell transistor. Accordingly, the unit anti-fuse cells of the anti-fuse circuit included in the redundant row decoder 1300 and/or the redundant column decoder 1550 of the semiconductor memory device 1000 may easily sense an anti-fusing state using a simple circuit configuration.

Accordingly, when a defective cell is included in the normal memory cell array 1110, the semiconductor memory device 1000 may safely replace the defective cell with a redundant memory cell.

Although FIG. 7 illustrates the semiconductor memory device 1000 including both the redundant row decoder 1300 and the redundant column decoder 1550, the semiconductor memory device may include any one of the redundant row decoder 1300 and the redundant column decoder 1550.

Figure 8:
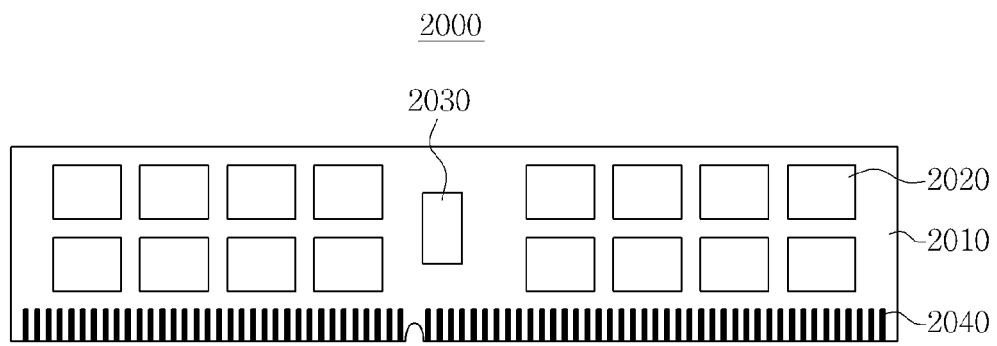
FIG. 8 is a plan view of a semiconductor module in which a semiconductor memory device including an anti-fuse circuit according to example embodiments.

FIG. 8 is a plan view of a semiconductor module 2000 in which a semiconductor memory device including an anti-fuse circuit according to example embodiments is mounted.

Referring to FIG. 8, the semiconductor module 2000 according to example embodiments may include a module substrate 2010, a plurality of semiconductor memory devices 2020, and a control chip package 2030. Input/output (I/O) terminals 2040 may be formed in the module substrate 2010. One or more of the semiconductor memory devices 2020 may include the anti-fuse circuit according to the foregoing example embodiments.

The semiconductor memory devices 2020 and the control chip package 2030 may be mounted on the module substrate 2010. The semiconductor memory devices 2020 and the control chip package 2030 may be electrically connected to the I/O terminals 2040 in series or parallel.

The semiconductor module 2000 may not include the control chip package 2030 in some applications. Each of the semiconductor memory devices 2020 may include a volatile memory chip, such as a dynamic random access memory (DRAM) or a static random access memory (SRAM), a non-volatile memory chip, such as a flash memory, a phase-change memory, a magnetic RAM (MRAM), or a resistive RAM (RRAM), or a combination thereof, stacked chips may be used as well.

Figure 9:
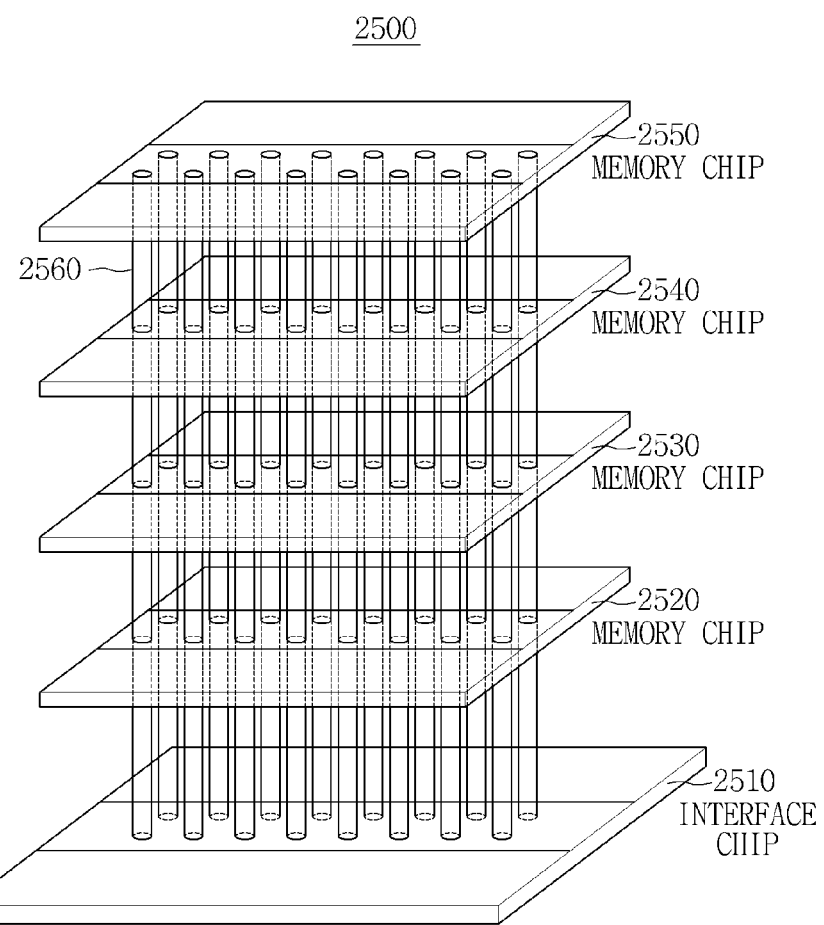
FIG. 9 is a simplified perspective view of a stack semiconductor device including a semiconductor memory device having an anti-fuse circuit according to example embodiments.

FIG. 9 is a simplified perspective view of a stack semiconductor device 2500 including a semiconductor memory device having an anti-fuse circuit according to example embodiments.

Referring to FIG. 9, the stack semiconductor device 2500 may include an interface 2510 and memory chips 2520, 2530, 2540, and 2550 electrically connected by through substrate vias, such as through-silicon vias (TSVs) 2560. Although FIG. 9 illustrates the TSVs 2560 disposed in two rows, the stack semiconductor device 2500 may include an arbitrary number of TSVs.

Each of the memory chips 2520, 2530, 2540, and 2550 included in the stack semiconductor device 2500 may include the anti-fuse circuit according to the foregoing example embodiments. The interface chip 2510 may serve as an interface between the memory chips 2520, 2530, 2540, and 2550 and an external apparatus.

Figure 10:
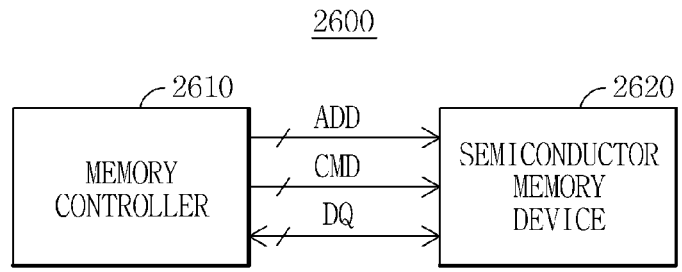
FIG. 10 is a block diagram of an example of a memory system including an anti-fuse circuit according to example embodiments.

FIG. 10 is a block diagram of an example of a memory system 2600 including an anti-fuse circuit according to example embodiments.

Referring to FIG. 10, the memory system 2600 may include a memory controller 2610 and a semiconductor memory device 2620.

The memory controller 2610 may generate an address signal ADD and a command CMD, and transmit the address signal ADD and the command CMD to the semiconductor memory device 2620 through buses. Data DQ may be transmitted from the memory controller 2610 to the semiconductor memory device 2620 through the buses, or transmitted from the semiconductor memory device 2620 to the memory controller 2610 through the buses.

The semiconductor memory device 2620 may include an anti-fuse circuit, which may include an anti-fuse cell driving circuit and unit anti-fuse cells. The anti-fuse cell driving circuit may generate a normal cell driving voltage and a vote cell driving voltage. Each of the unit anti-fuse cells may include a normal cell transistor and a vote cell transistor connected in parallel to each other, and perform a fusing operation in response to the normal cell driving voltage and the vote cell driving voltage. Accordingly, the unit anti-fuse cells of the anti-fuse circuit included in the semiconductor memory device 2620 may easily sense an anti-fuse state using a simple circuit configuration.

Figure 11:
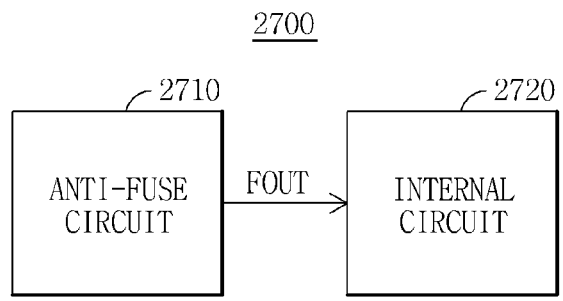
FIG. 11 is a block diagram of an example of a semiconductor device including an anti-fuse circuit according to example embodiments.

FIG. 11 is a block diagram of an example of a semiconductor device 2700 including an anti-fuse circuit according to example embodiments.

Referring to FIG. 11, the semiconductor device 2700 may include an anti-fuse circuit and an internal circuit 2720.

The anti-fuse circuit 2710 may include an anti-fuse cell driving circuit and unit anti-fuse cells. The anti-fuse cell driving circuit may generate a normal cell driving voltage and a vote cell driving voltage. Each of the unit anti-fuse cells may include a normal cell transistor and a vote cell transistor connected in parallel to each other, and perform a fusing operation in response to the normal cell driving voltage and the vote cell driving voltage. Accordingly, the unit anti-fuse cells of the anti-fuse circuit 2710 may easily sense an anti-fusing state using a simple circuit configuration.

The anti-fuse circuit may perform an anti-fusing operation and generate an anti-fuse output voltage FOUT. The internal circuit 2720 may perform a specific operation in response to the anti-fuse output voltage FOUT. The specific operation may include selecting an operation mode of the semiconductor device 2700, or enabling a redundancy array when a defective cell is included in a memory cell array.

Figure 12:
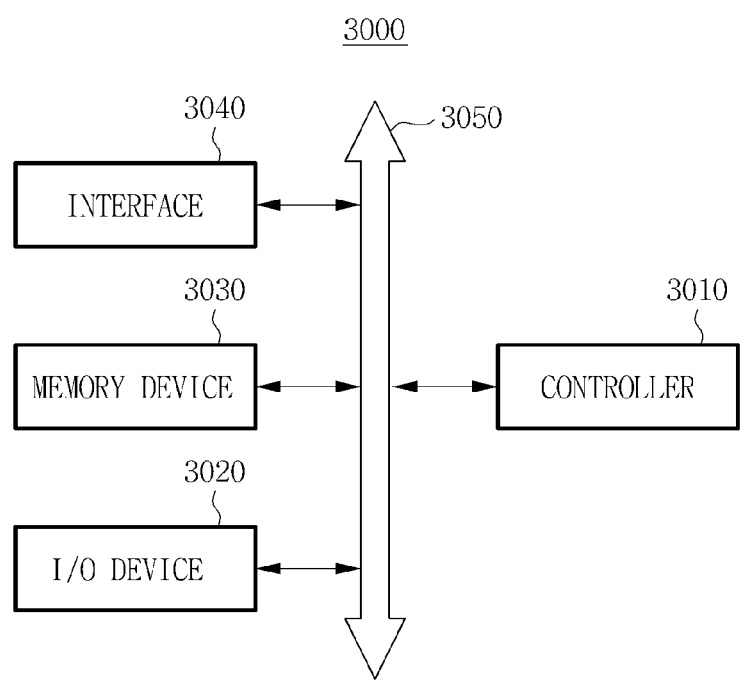
FIG. 12 is a block diagram of an example of an electronic system including a semiconductor memory device having an anti-fuse circuit according to example embodiments.

FIG. 12 is a block diagram of an example of an electronic system 3000 including a semiconductor memory device having an anti-fuse circuit according to example embodiments.

Referring to FIG. 12, the electronic system 3000 according to example embodiments may include a controller 3010, an I/O device 3020, a memory device 3030, an interface 3040, and a bus 3050.

The bus 3050 may provide a path through which data may be transmitted among the controller 3010, the I/O device 3020, the memory device 3030, and the interface 3040.

The controller 3010 may include at least one of at least one microprocessor (MP), at least one digital signal processor (DSP), at least one microcontroller (MC), and logic devices capable of similar functions thereto. The I/O device 3020 may include at least one of a keypad, a keyboard, and a display device. The memory device 3030 may serve to store data and/or commands executed by the controller 3010.

The memory device 3030 may include a volatile memory chip, such as a DRAM or an SRAM, a non-volatile memory chip, such as a flash memory, a phase-change memory, an MRAM), or an RRAM, or a combination thereof. The memory device 3030 may be a semiconductor memory device including the anti-fuse circuit according to the embodiments described herein.

The interface 3040 may serve to transmit/receive data to/from a communication network. The interface 3040 may include an antenna or a wired/wireless transceiver and transmit/receive data by wire or wirelessly. Also, the interface 3040 may include an optical fiber and transmit/receive data through the optical fiber. An application chipset, a camera image processor (CIP), and an I/O device may be further provided in the electronic system 3000.

The electronic system 3000 may be embodied by a mobile system, a personal computer (PC), an industrial computer, or a logic system with various functions. For example, the mobile system may be any one of a personal digital assistant (PDA), a portable computer (PC), a web tablet, a mobile phone, a wireless phone, a laptop computer, a memory card, a digital music system, and a data transmission/receiving system.

When the electronic system 3000 is an apparatus capable of wireless communication, the electronic system 3000 may be used for a communication system, such as a code division multiple access (CDMA), a global system for mobile communication (GSM), a North American digital cellular (NADC), an enhanced-time division multiple access (E-TDMA), a wideband code division multiple access (WCDMA), or CDMA2000.

The present disclosure may be applied to a semiconductor device, particularly, a semiconductor memory device and a memory module and memory system including the same.

An anti-fuse circuit according to example embodiments of the present disclosure may include an anti-fuse cell driving circuit configured to generate a normal cell driving voltage and a vote cell driving voltage, and a plurality of unit anti-fuse cells. Each of the unit anti-fuse cells can include a normal cell transistor and a vote cell transistor connected in parallel to each other, and perform a fuse operation in response to the normal cell driving voltage and the vote cell driving voltage. Accordingly, the anti-fuse circuit including the unit anti-fuse cells can easily sense an anti-fusing state, for example, a unit anti-fuse cell having a broken gate oxide layer, using a simple circuit configuration. As a result, a semiconductor device including the anti-fuse circuit according to the example embodiments may occupy a small area within a semiconductor chip and consume little power.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. An anti-fuse circuit comprising:
   an anti-fuse cell array including a plurality of anti-fuse cells, each anti-fuse cell including a normal cell transistor and a vote cell transistor connected in parallel to each other; and
   an anti-fuse cell driving circuit configured to generate a normal cell driving voltage applied to the normal cell transistor, and a vote cell driving voltage applied to the vote cell transistor,
   wherein the normal cell transistor is configured to store data in response to the normal cell driving voltage having a first voltage level and the vote cell driving voltage having a second voltage level lower than the first voltage level, and
   wherein when the normal cell transistor has defect data, the vote cell transistor is configured to store data in response to the vote cell driving voltage having the first voltage level.

2. The circuit of claim 1, wherein the anti-fuse cell driving circuit is configured to generate the normal cell driving voltage and the vote cell driving voltage based on an address.

3. The circuit of claim 2, wherein the normal cell driving voltage and the vote cell driving voltage are generated based on the same address.

4. The circuit of claim 3, wherein the address used to generate the normal cell driving voltage and the vote cell driving voltage is selected in response to a test mode register set (TMRS) signal.

5. The circuit of claim 1, wherein each of the normal cell transistor and the vote cell transistor have a first terminal, a second terminal, and a gate terminal with a gate insulation layer, respectively, and
   wherein the normal cell driving voltage is applied to a gate terminal of the normal cell transistor, and the vote cell driving voltage is applied to a gate terminal of the vote cell transistor.

6. The circuit of claim 5, wherein the normal cell transistor is configured to store data when the first terminal of the normal cell transistor is floated.

7. The circuit of claim 6, wherein when the vote cell transistor stores data, the gate terminal of the normal cell transistor is floated.

8. The circuit of claim 1, further comprising:
   a MOS transistor having a gate terminal to which a driving signal is applied, a first terminal connected to a first node, and a second terminal connected to an output node, the MOS transistor configured to form a current path between the first node and the output node in response to the driving signal,
   wherein the normal cell transistor includes a gate terminal to which the normal cell driving voltage is applied, a first terminal, and a second terminal electrically connected to the first node, the normal cell transistor configured to break down a gate insulation layer in response to the normal cell driving voltage, and
   wherein the vote cell transistor includes a gate terminal to which the vote cell driving voltage is applied, a first terminal, and a second terminal electrically connected to the first node, the vote cell transistor configured to break down a gate insulation layer in response to the vote cell driving voltage.

9. The circuit of claim 8, wherein a current path is formed between the gate terminal of the normal cell transistor and the first node in response to the normal cell driving voltage having the first voltage level, and a current path is formed between the gate terminal of the vote cell transistor and the first node in response to the vote cell driving voltage having the first voltage level.

10. The circuit of claim 8, wherein the normal cell transistor is configured to store data when a level of the driving signal is the second voltage level.

11. The circuit of claim 8, wherein the vote cell transistor is configured to store data when the gate terminal of the normal cell transistor is floated, and a level of the driving signal is the second voltage level.

12. An anti-fuse cell comprising:
   a first MOS transistor having a control terminal to which a first cell driving voltage is applied, a floated first terminal, and a second terminal connected to a first node, the first MOS transistor configured to store data in response to the first cell driving voltage;
   a second MOS transistor having a control terminal to which a second cell driving voltage is applied, a floated first terminal, and a second terminal connected to the first node, the second MOS transistor configured to store data in response to the second cell driving voltage; and
   a third MOS transistor having a control terminal to which a driving signal is applied, a first terminal connected to the first node, and a second terminal connected to a bit line, the third MOS transistor configured to form a current path between the first node and the bit line in response to the driving signal,
wherein the second MOS transistor is configured to store data when the first MOS transistor has defect data.

13. The anti-fuse cell of claim 12, wherein the first and second MOS transistors each include a gate insulation layer, and
wherein the data is determined as a logic low level or a logic high level depending on whether the gate insulation layer is broken or not.

14. The anti-fuse cell of claim 13, wherein the first MOS transistor is configured to break the gate insulation layer of the first MOS transistor when the first cell driving voltage has a first voltage level, the second cell driving voltage has a second voltage level lower than the first voltage level, the driving signal has the second voltage level, and a voltage having a third voltage level lower than the second voltage level is applied to the bit line.

15. The anti-fuse cell of claim 13, wherein the second MOS transistor is configured to break the gate insulation layer of the second MOS transistor when the control terminal of the first MOS transistor is floated, the second cell driving voltage has a first voltage level, the driving signal has a second voltage level lower than the first voltage level, and a voltage having a third voltage level lower than the second voltage level is applied to the bit line.

16. A memory device comprising:
an anti-fuse cell array including a plurality of anti-fuse cells, each anti-fuse cell including a first cell transistor connected to a common node, a second cell transistor connected to the common node, and an access transistor connected to the common node,
wherein the first and second cell transistors are configured to store data,
wherein the second cell transistor is configured to store data when the first cell transistor has defect data,
wherein each transistor of the first and second cell transistors includes a first terminal, a second terminal, and a gate terminal with a gate insulation layer, and
wherein the memory device is configured so that;
when the first cell transistor stores data, a first voltage is applied to a gate terminal of the first cell transistor and a second voltage lower than the first voltage is applied to gate terminals of the second cell transistor and the access transistor.

17. The memory device of claim 16, wherein the data is determined as a logic low level or a logic high level depending on whether the gate insulation layer is broken or not.

18. The memory device of claim 16, wherein the memory device is further configured so that:
when the second cell transistor stores data, the gate terminal of the first cell transistor is floated, the first voltage is applied to the gate terminal of the second transistor, and the second voltage lower than the first voltage is applied to the gate terminal of the access transistor.

19. The memory device of claim 16, further comprising a third cell transistor connected to the common node, wherein the third cell transistor is configured to store data when the second cell transistor has defect data.

* * * * *